US008737085B2

(12) United States Patent
Sasaoka

(10) Patent No.: US 8,737,085 B2
(45) Date of Patent: May 27, 2014

(54) WIRING BOARD WITH A BUILT-IN COMPONENT AND METHOD FOR MANUFACTURING THE SAME

(75) Inventor: Kenji Sasaoka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 520 days.

(21) Appl. No.: 12/299,861

(22) PCT Filed: May 24, 2006

(86) PCT No.: PCT/JP2006/310327
§ 371 (c)(1),
(2), (4) Date: Nov. 6, 2008

(87) PCT Pub. No.: WO2007/135737
PCT Pub. Date: Nov. 29, 2007

(65) Prior Publication Data
US 2009/0107715 A1 Apr. 30, 2009

(51) Int. Cl.
*H05K 1/18* (2006.01)
(52) U.S. Cl.
USPC ........... 361/761; 361/749; 361/750; 361/751; 361/762; 361/763; 361/764; 174/250; 174/254; 174/255; 174/260; 174/261; 174/262; 174/266
(58) Field of Classification Search
USPC ........... 174/250–268; 361/761–764, 749–751
See application file for complete search history.

(56) References Cited

U.S. PATENT DOCUMENTS

| | | | |
|---|---|---|---|
| 6,324,067 B1 * | 11/2001 | Nishiyama | 361/761 |
| 6,359,235 B1 | 3/2002 | Hayashi | |
| 6,489,685 B2 * | 12/2002 | Asahi et al. | 257/774 |
| 6,724,638 B1 | 4/2004 | Inagaki et al. | |
| 6,876,554 B1 | 4/2005 | Inagaki et al. | |
| 6,975,516 B2 | 12/2005 | Asahi et al. | |

(Continued)

FOREIGN PATENT DOCUMENTS

| | | |
|---|---|---|
| CN | 1366446 A | 8/2002 |
| EP | 1 304 742 A2 | 4/2003 |

(Continued)

OTHER PUBLICATIONS

International Preliminary Report on Patentability and Written Opinion issued by the International Bureau of WIPO on Dec. 24, 2008, for International Application No. PCT/JP2006/310327.

(Continued)

*Primary Examiner* — Hung S Bui
*Assistant Examiner* — James Wu
(74) *Attorney, Agent, or Firm* — Finnegan, Henderson, Farabow, Garrett & Dunner, L.L.P.

(57) ABSTRACT

Disclosed is a wiring board with a built-in component and a method for manufacturing the same, the wiring board including: a wiring pattern; an electric/electronic component electrically and mechanically connected with a surface of said wiring pattern; and an insulating layer formed on the same surface of said wiring pattern as said electric/electronic component is connected and configured so as to embed said electric/electronic component, said insulating layer having an insulating resin and a reinforcing material included in the insulating resin, wherein the reinforcing material of said insulating layer exists in the insulating resin without reaching a region of said electric/electronic component in a lateral direction, and wherein the insulating resin of said insulating layer reaches said electric/electronic component so as to adhere to said electric/electronic component.

22 Claims, 8 Drawing Sheets

(a)

(b)

(56) References Cited

U.S. PATENT DOCUMENTS

| | | | |
|---|---|---|---|
| 7,080,446 | B2 | 7/2006 | Baba et al. |
| 7,294,587 | B2 | 11/2007 | Asahi et al. |
| 7,307,852 | B2 | 12/2007 | Inagaki et al. |
| 7,342,803 | B2 | 3/2008 | Inagaki et al. |
| 7,855,894 | B2 | 12/2010 | Inagaki et al. |
| 7,864,542 | B2 | 1/2011 | Inagaki et al. |
| 7,864,543 | B2 | 1/2011 | Inagaki et al. |
| 7,881,069 | B2 | 2/2011 | Inagaki et al. |
| 7,978,478 | B2 | 7/2011 | Inagaki et al. |
| 7,995,352 | B2 | 8/2011 | Inagaki et al. |
| 8,107,253 | B2 | 1/2012 | Inagaki et al. |
| 8,116,091 | B2 | 2/2012 | Inagaki et al. |
| 2002/0135058 | A1 | 9/2002 | Asahi et al. |
| 2003/0062624 | A1 | 4/2003 | Asahi et al. |
| 2004/0202781 | A1 | 10/2004 | Higashitani |
| 2005/0212146 | A1* | 9/2005 | Imaoka et al. ............... 257/784 |
| 2005/0218503 | A1* | 10/2005 | Abe et al. .................... 257/700 |
| 2006/0131740 | A1* | 6/2006 | Kawabata et al. ............ 257/723 |
| 2006/0133057 | A1* | 6/2006 | McGregor et al. ............ 361/763 |
| 2006/0154496 | A1* | 7/2006 | Imamura et al. ............... 439/66 |
| 2006/0231939 | A1* | 10/2006 | Kawabata et al. ............ 257/686 |
| 2008/0158841 | A1 | 7/2008 | Inagaki et al. |
| 2010/0014261 | A1 | 1/2010 | Inagaki et al. |
| 2010/0226108 | A1 | 9/2010 | Inagaki et al. |
| 2012/0006469 | A1 | 1/2012 | Inagaki et al. |

FOREIGN PATENT DOCUMENTS

| | | | |
|---|---|---|---|
| JP | 04-283987 | 10/1992 | |
| JP | 2001-352141 | 12/2001 | |
| JP | 2002-43755 | 2/2002 | |
| JP | 2002-93957 | 3/2002 | |
| JP | 2002-270712 | 9/2002 | |
| JP | 2002270712 A * | 9/2002 | ............ H01L 23/12 |
| JP | 2003-197849 | 7/2003 | |
| JP | 2003-204167 | 7/2003 | |
| JP | 2004-063583 | 2/2004 | |
| JP | 2004-200201 | 7/2004 | |
| JP | 2004-311736 | 11/2004 | |
| JP | 2005-142178 | 6/2005 | |
| JP | 2005-150395 | 6/2005 | |
| JP | 2005-158806 | 6/2005 | |
| JP | 2005 302991 | 10/2005 | |
| JP | 2005-333109 | 12/2005 | |
| JP | 2006-114621 | 4/2006 | |
| WO | WO 2005/008733 | 1/2005 | |
| WO | WO 2005/101934 | 10/2005 | |
| WO | WO 2006-013230 | 2/2006 | |

OTHER PUBLICATIONS

International Search Report for international application PCT/JP2006/310327 dated Jun. 20, 2006.
Hearing in the Prosecution of the Appeal issued by the Japanese Patent Office on Apr. 19, 2011, for Japanese Patent Application No. 2004-344485, and English-language Summary thereof.
European Search Report in Application No. 06756533.3 dated Jun. 16, 2011 (9 pages).
Official communication issued from Japanese Patent Office in counterpart Japanese Patent Application No. 2010-158979, dated Jan. 24, 2012, (2 pages).
Official communication issued from European Patent Office in counterpart European Patent Application No. 06756533.3, dated Jun. 22, 2012, (8 pages).
Official communication issued by Japan Patent Office, dated Oct. 2, 2012 for counterpart Japan Patent Application No. 2008-516533 (7 pages).
Notice of Reasons for Refusal issued by the Japanese Patent Office on Jul. 10, 2012, for Japanese Patent Application No. 2010-158979, and English-language translation thereof.
Notification of Reasons for Refusal of Japanese Application No. JP 2012-070203, dated May 7, 2013 (3 pages).
$2^{nd}$ Examination Notice-Chinese Office Action of Chinese Application No. 200680054696.X dated Feb. 2, 2012, (7 pages).

* cited by examiner (a)

(b)

(c)

(d)

(a)

(b)

(a)

(b)

(a)

(b)

(c)

(a)

(b)

(c)

WIRING BOARD WITH A BUILT-IN COMPONENT AND METHOD FOR MANUFACTURING THE SAME

TECHNICAL FIELD

The present invention relates to a wiring board with a built-in component such as electric/electronic component which is embedded in an insulating substrate, and a method for manufacturing the wiring board. Particularly, the present invention relates to a wiring board with a built-in component and the method for manufacturing the wiring board which are suitable for the reduction of load in the manufacture thereof.

BACKGROUND ART

A conventional wiring board with a built-in component is disclosed in Reference 1. The conventional wiring board has a multilayered wiring structure with a plurality of wiring (patterned) layers and is configured such that an electronic component is mounted on one of the inner wiring (patterned) layers of the multilayered wiring structure. In this case, the electronic component is embedded in an insulating layer which is formed as a sheet from a mixture of an insulating resin and a filler made by means of doctor blade method. In the laminating process, the corresponding insulating layer to embed the electronic component has no depressed portion and no opening. Alternatively, the corresponding insulating layer may have a depressed portion smaller than the electronic component.
Patent Reference 1: JP-A 2003-197849 (KOKAI)

SUMMARY OF THE INVENTION

Problems to be Solved by the Invention

With the conventional wiring board and manufacturing method, it is difficult to use, as the insulating layer, a prepreg containing a glass cloth or aramid resin fiber as a reinforcing material which is normally employed for a printed wiring board. Namely, a specific insulating material exclusive for the conventional wiring board is required, but in view of the availability and cost of the specific insulating material, the conventional wiring board has some disadvantages. Moreover, if the prepreg is forcedly employed for the conventional wiring board, the glass fiber or the like of the prepreg may press the electronic component to be built in the prepreg so as to destroy the electronic component and/or the connection between the electronic component and an inner wiring layer for the electronic component to be connected originated from the stress of the glass fiber against the electronic component.

The present invention is conceived so as to iron out the above-mentioned problems, and thus, it is an object of the present invention to provide a wiring board with a built-in component such as an electric/electronic component to be embedded in an insulating layer and a method for manufacturing the wiring board which can reduce the load in manufacture and enhance the reliability.

Means for Solving the Problem

In order to iron out the above-described problems, the present invention relates to a wiring board with a built-in component, including: a wiring pattern; an electric/electronic component which is electrically and mechanically connected with the wiring pattern; and an insulating layer which is formed on the same surface of the wiring pattern as the electric/electronic component is connected and configured so as to embed the electric/electronic component and to contain a reinforcing material except a region for the electric/electronic component to be embedded.

Namely, the insulating layer for embedding the electric/electronic component contains the reinforcing material except the region for the component to be embedded. The insulating layer does not contain the reinforcing material in the region of the electric/electronic component and contains the reinforcing material in another region. Therefore, the reinforcing material is not pressed against the electric/electronic component so that the reliability of the electric/electronic component can be enhanced. The insulating layer may be made by hardening a normal prepreg available for a wiring board.

The present invention also relates to a method for manufacturing a wiring board with a built-in component, including the steps of: electrically and mechanically connect an electric/electronic component with a first foil or a first metallic wiring pattern formed on a first insulating layer; disposing, on the first foil or the first metallic wiring pattern, a second insulating layer having an opening for accommodating the electric/electronic component and having a reinforcing material therein; and disposing a second metallic foil or a third insulating layer on the second insulating layer, thereby conducting integration step to integrate the electric/electronic component, the first foil or first metallic wiring pattern, the first insulating layer, the second insulating layer, and the second metallic foil or third insulating layer.

According to the manufacturing method, the insulating layer (second insulating layer) for embedding the electric/electronic component does not contain the reinforcing material in the region of the electric/electronic component and contains the reinforcing material in another region. Therefore, the reinforcing material is not pressed against the electric/electronic component so that the reliability of the electric/electronic component can be enhanced.

The second insulating layer may be made by a normal prepreg available for a wiring board. Therefore, the prepreg is rendered fluid at the integration step to embed the space around the electric/electronic component and thus, cover the electric/electronic component. As a result, after the prepreg is hardened, the thus obtained insulating layer adheres to the electric/electronic component. In this way, since the electric/electronic component is disposed in the opening, excess pressure is not applied against the electric/electronic component through the heating and pressing at the integration step so that the electric/electronic component can be sufficiently insulated.

Effect of the Invention

According to the present can be provided a wiring board with a built-in component such as an electric/electronic component to be embedded in an insulating layer and a method for manufacturing the wiring board which can reduce the load in manufacture and enhance the reliability.

EXPLANATION OF REFERENCE NUMERALS

Figure 1:
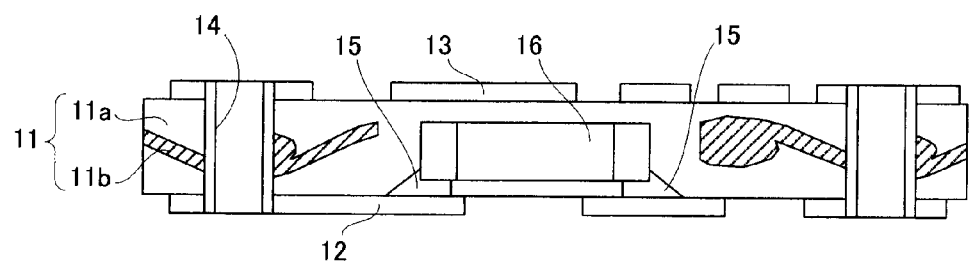
FIG. 1 relates to a cross sectional view schematically showing the structure of a wiring board with a built-in component according to an embodiment of the present invention.

1 . . . insulating layer; 1a . . . insulating resin; 1b . . . reinforcing material; 2 . . . insulating layer; 2a . . . insulating resin; 2b . . . reinforcing material; 3 . . . insulating layer; 3a . . . insulating resin; 3b . . . reinforcing material; 4, 5, 6, 7 . . . wiring pattern; 11 . . . insulating layer; 11a . . . insulating resin; 11b . . . reinforcing material; 11A . . . prepreg; 11o . . . opening; 12, 13 . . . wiring pattern; 12A, 13A . . . metallic foil (copper foil); 14 . . . conductive layer on inner wall of through-hole; 15 . . . solder; 16 . . . component; 31 . . . insulating layer; 31a . . . insulating resin; 31b . . . reinforcing material; 31A . . . prepreg; 32 . . . insulating layer; 32a . . . insulating resin; 32b . . . reinforcing material; 32o . . . opening; 33 . . . insulating layer; 33a . . . insulating resin; 33b . . . reinforcing material; 33A . . . prepreg; 34, 35, 36, 37 . . . wiring pattern; 34A, 37A . . . metallic foil (copper foil); 38 conductive layer on inner wall of through-hole; 40 . . . solder; 41 . . . component; 51 . . . insulating layer; 51a . . . insulating resin; 51b . . . reinforcing material; 52, 53 . . . wiring pattern; 52A, 53A . . . metallic foil (copper foil); 54 . . . interlayer connector (conductive bump made of conductive composition by means of printing); 61 . . . insulating layer; 61a . . . insulating resin; 61b reinforcing material; 62, 63 . . . wiring pattern; 64 . . . interlayer connector (conductive bump made of conductive composition by means of printing); 74, 84 . . . interlayer connector (conductive bump made of etched metallic plate); 74A . . . metallic plate; 79 . . . etching mask; 94, 104 . . . interlayer connector (fill of conductive composition); 114, 124 . . . interlayer connector (plated conductive bump); 119 . . . plate-stopping mask; 119A . . . mask removing portion; 201, 202, 203, 204, 205 . . . interlayer connector (conductive bump made of conductive composition by means of printing); ES . . . etching stopper layer; 111, 112, 113, 114, 115, 116 . . . interlayer connector

BEST MODE FOR IMPLEMENTING THE INVENTION

In an embodiment of the present invention, the insulating layer is at least two insulating layers which are laminated one another, and a second wiring pattern is formed so as to be sandwiched by the at least two insulating layers. The embodiment is suitable for the formation of a multilayered wiring pattern.

In this case, a third wiring pattern may be formed on an opposite surface of one of the at least two insulating layers to a surface thereof adjacent to the second wiring pattern, the one of the at least two insulating layers being not adjacent to the wiring pattern; and a second interlayer connector may be formed so as to be sandwiched between the second wiring pattern and the third wiring pattern by penetrating through the one of the at least two insulating layers.

The interlayer connector may made of conductive composition and configured such that the symmetric axis of the interlayer connector is formed along the stacking direction of the wiring board and the diameter of the interlayer connector is varied along the symmetric axis. The interlayer connector is classified as an interlayer connector penetrating through the insulating layer not adjacent to the wiring pattern, and typified by a conductive bump made of conductive composition by means of printing, for example.

The interlayer connector may made of conductive composition and configured such that the symmetric axis of the interlayer connector is formed along the stacking direction of the wiring board and the diameter of the interlayer connector is not varied along the symmetric axis. The interlayer connector is also classified as an interlayer connector penetrating through the insulating layer not adjacent to the wiring pattern, and typified by an interlayer connector made by filling the through-hole in the insulating layer with conductive composition.

The interlayer connector may be made of metallic material and configured such that the symmetric axis of the interlayer connector is formed along the stacking direction of the wiring board and the diameter of the interlayer connector is varied along the symmetric axis. The interlayer connector is also classified as an interlayer connector penetrating through the insulating layer not adjacent to the wiring pattern, and typified by a conductive bump formed by etching a metallic plate, for example.

The interlayer connector may be made of metallic material and configured such that the symmetric axis of the interlayer connector is formed along the stacking direction of the wiring board and the diameter of the interlayer connector is not varied along the symmetric axis. The interlayer connector is also classified as an interlayer connector penetrating through the insulating layer not adjacent to the wiring pattern, and typified by a conductive bump formed by means of metal plating.

Moreover, an interlayer connector may be formed so as to be sandwiched between the wiring pattern and the second wiring pattern by penetrating through one of at least two insulating layers adjacent to the wiring pattern.

The interlayer may be made of conductive composition and configured such that the symmetric axis of the interlayer connector is formed along the stacking direction of the wiring board and the diameter of the interlayer connector is varied along the symmetric axis. The interlayer connector is classified as an interlayer connector penetrating through the insulating layer adjacent to the wiring pattern, and typified by a conductive bump made of conductive composition by means of printing, for example.

The interlayer may be made of conductive composition and configured such that the symmetric axis of the interlayer connector is formed along the stacking direction of the wiring board and the diameter of the interlayer connector is not varied along the symmetric axis. The interlayer connector is classified as an interlayer connector penetrating through the insulating layer adjacent to the wiring pattern, and typified by an interlayer connector made by filling the through-hole in the insulating layer with conductive composition.

In an embodiment, a second insulating layer may be formed on a different surface of the wiring pattern from that the electric/electronic component is connected. In this case, the wiring pattern connected with the electric/electronic component is constituted as an inner wiring pattern.

In this point of view, a second wiring pattern may be formed on an opposite surface of the second insulating layer to a surface thereof adjacent to the wiring pattern.

Moreover, an interlayer connector may be made of conductive composition and sandwiched between the wiring pattern and the second wiring pattern by penetrating through the second insulating layer and configured such that the symmetric axis of the interlayer connector is formed along the stacking direction of the wiring board and the diameter of the interlayer connector is varied along the symmetric axis. The interlayer connector is classified as an interlayer connector penetrating through the insulating layer not adjacent to the wiring pattern, and typified by a conductive bump made of conductive composition by means of printing.

Furthermore, an interlayer connector may be made of conductive composition and sandwiched between the wiring pattern and the second wiring pattern by penetrating through the second insulating layer and configured such that the symmetric axis of the interlayer connector is formed along the stacking direction of the wiring board and the diameter of the interlayer connector is not varied along the symmetric axis. The interlayer connector is classified as another interlayer connector, and typified by an interlayer connector made by filling the through-hole in the insulating layer with conductive composition.

An interlayer connector may be made of metallic material and sandwiched between the wiring pattern and the second wiring pattern by penetrating through the second insulating layer and configured such that the symmetric axis of the interlayer connector is formed along the stacking direction of the wiring board and the diameter of the interlayer connector is varied along the symmetric axis. The interlayer connector is classified as another interlayer connector, and typified by a conductive bump formed by etching a metallic plate.

An interlayer connector may be made of metallic material and sandwiched between the wiring pattern and the second wiring pattern by penetrating through the second insulating layer and configured such that the symmetric axis of the interlayer connector is formed along the stacking direction of the wiring board and the diameter of the interlayer connector is not varied along the symmetric axis. The interlayer connector is classified as another interlayer connector penetrating through the insulating layer not adjacent to the wiring pattern, and typified by a conductive bump formed by means of metal plating.

Also, a conductor may be formed on an inner wall of a through hole formed in the second insulating layer so as to electrically connect the wiring pattern and the second wiring pattern. Such a conductor is a type of a normal interlayer connector.

In an embodiment relating to the manufacturing method, an additional semi-hardened insulating layer containing a reinforcing material is provided so as to be rendered fluid to embed a space around the electric/electronic component disposed in the opening, and then, hardened through the heating step.

Then, some embodiments of the present invention will be described with reference to the drawings. FIG. 1 relates to a cross sectional view schematically showing the structure of a wiring board with a built-in component according to an embodiment of the present invention. As shown in FIG. 1, the wiring board with a built-in component includes an insulating layer 11, wiring patterns 12, 13, conductive layers 14 formed on the inner wall of the respective through-holes, solders 15 and an electric/electronic component 16. The insulating layer 11 is made of an insulating resin 11a and a reinforcing material (e.g., glass cloth) 11b for reinforcing the insulating resin 11a The electric/electronic component 16 is embedded in the insulating layer 11, and electrically and mechanically connected with the wiring pattern 12 via the solders 15. The insulating layer 11 is laminated on the same surface of the wiring pattern 12 as the electric/electronic component 16 is connected, and the wiring pattern 13 is provided on the other surface of the insulating layer 11 opposite to the surface connecting with the wiring pattern 12. The reinforcing material 11b of the insulating layer 11 is not provided in the region for the electric/electronic component 16 to be embedded. The wiring patterns 12 and 13, provided at the respective surfaces of the insulating layer 11, are electrically connected one another with the conductive layers 14 formed at the inner walls of the respective through holes in the insulating layer 11. In the wiring board of this embodiment, a prepreg made of glass-epoxy resin can be easily employed as the insulating layer 11.

Figure 2:
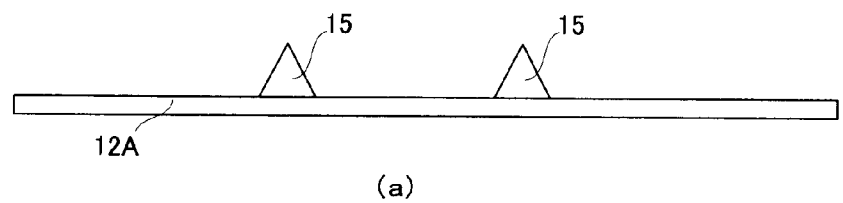
FIG. 2 relates to cross sectional views schematically showing the manufacturing steps of the wiring board shown in FIG. 1.
Figure 2:
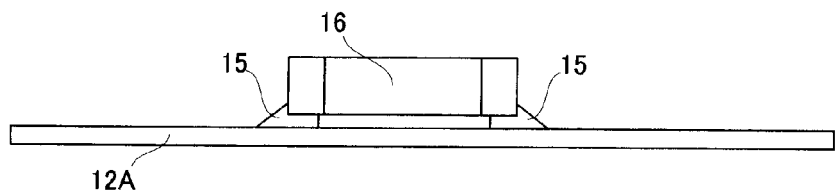
Figure 2:
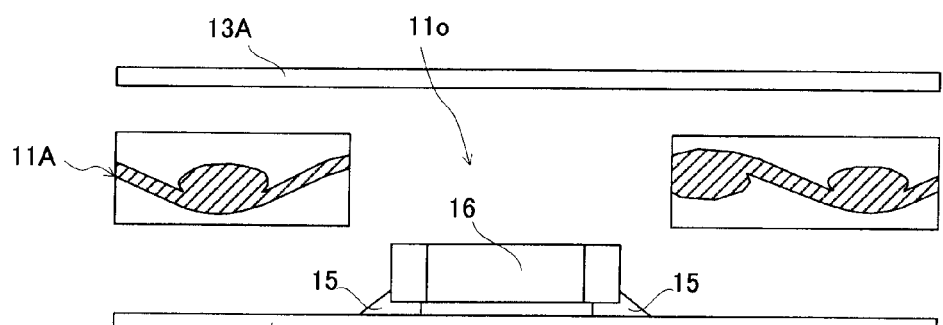
Figure 2:
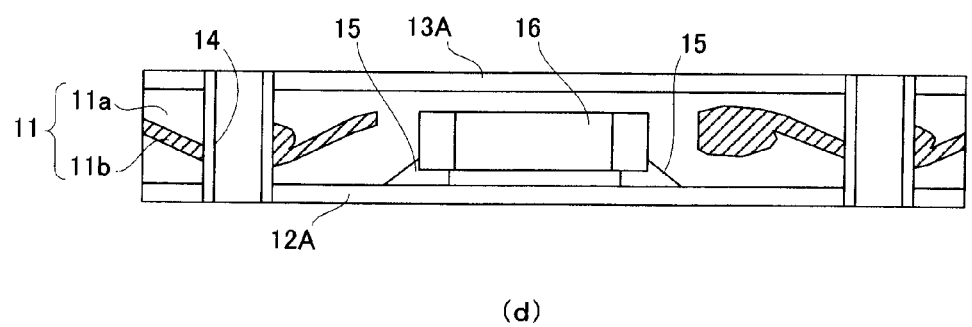

Then, the manufacturing process of the wiring board shown in FIG. 1 will be described referring to FIG. 2. FIG. 2 relates to cross sectional views schematically showing the manufacturing steps of the wiring board shown in FIG. 1.

First of all, as shown in FIG. 1, a metallic foil (e.g., electrolytic copper foil) with a thickness of e.g., 18 μm to be formed as the wiring pattern 12 is prepared, and the solders 15 under cream condition are applied on predetermined positions of the metallic foil 12A by means of screen printing. Then, as shown in FIG. 2B, the electric/electronic component (e.g., a chip resistance with 0603 size or 0402 size) 16 is disposed on the solders 15 so that both ends of the electric/electronic component 16 can be contacted with the solders 15. Then, the solders 15 are reflowed so that the electric/electronic component 16 is electrically and mechanically connected with the metallic foil 12A.

Then, a prepreg 11A made of glass-epoxy resin to be formed as the insulating layer 11 (e.g., with a thickness of 150 μm) is prepared, and drilled to form an opening 11o for disposing the electric/electronic component 16 to be built-in. When the size of the electric/electronic component 16 is set to 0603 size, the diameter of the opening 11o may be set to 0.8 mm. Then, as shown in FIG. 2C, the prepreg 11A with the opening 11o and the metallic foil (electrolytic copper foil) 13A with a thickness of 18 μm are aligned for and laminated on the surface of the metallic foil 12A with the electric/electronic component 16 thereon.

After lamination, the prepreg 11A is heated to be rendered fluid and pressed along the stacking direction of the obtained laminated body so that the prepreg 11A, the metallic foils 12, 13 and the electric/electronic component 16 of the laminated body are integrated one another. In this case, the insulating resin 11a of the prepreg 11A embeds the space around the electric/electronic component 16 so as to be adhered with the electric/electronic component 16. In this case, the prepreg 11A is perfectly hardened to be the insulating layer 11. In the integrated laminated body, since the opening 11o, corresponding to the position for disposing the electric/electronic component 16, is preliminarily formed at the prepreg 11A, the electric/electronic component 16 can not be pressed excessively through the disposition thereof. Therefore, excess stress can not occur at the connection (solders 15) between the electric/electronic component 16 and the metallic foil 12A and the electric/electronic component 16 can not be destroyed so that the reliability of the electric/electronic component 16, that is, the wiring board can be enhanced.

In the pressing process and heating process, the pressing pressure may be set within a range of 20 to 50 kg/cm² and the heating temperature may be set within a range of 125 to 175° C. The heating process may be conducted at single-step, but may be at multi-steps. In the latter case, the heating process is conducted at 125° C. for 30 minutes and then, conducted at 175° C. for one hour. The heating process may be conducted under vacuum condition.

In the case that the prepreg 11A is made of BT resin, the pressing pressure may be set within a range of 20 to 50 kg/cm² and the heating temperature may be set within a range of 130 to 200° C. In this case, the heating process may be conducted at single-step, but may be at multi-steps. In the latter case, the heating process is conducted at 130° C. for 30 minutes and then, conducted at 200° C. for 90 minutes. The heating process may be conducted under vacuum condition.

If the pressing process and the heating process are conducted under the conditions as described above, the prepreg 11A can be perfectly rendered fluid.

After lamination and integration, drilling and plating are conducted as is well known to form the both-sided shielding substrate with the conductive layers 14 formed at the inner walls of the respective through holes. Moreover, the metallic foils 12A and 13A are patterned by means of well known photolithography to form the wiring patterns 12 and 13. As a result, the wiring board with a built-in component as shown in FIG. 1 can be formed.

In this embodiment, the solders 15 are employed so as to connect the electric/electronic component 16 with the metallic foil 12A, but conductive adhesives may be employed instead of the solders 15. In this embodiment, the glass-epoxy resin is employed as the reinforcing material 11b, but an aramid cloth, a glass nonwoven cloth or an aramid nonwoven cloth may be employed instead of the glass-epoxy resin.

The surface of the opening 11o may be shaped circle or rectangle. The diameter of the circular opening 11o may be set within a range of 0.45 to 1.0 mm and the size of the rectangular opening 11o may be set within a range of 0.41 mm×0.21 mm to 0.7 mm×0.5 mm. In this case, the opening 11o is suitable for disposing and embedding a 0402 chip (0.4 mm×0.2 mm) as the electric/electronic component 16.

The diameter of the circular opening 11o may be set within a range of 0.68 to 1.5 mm and the size of the rectangular opening 11o may be set within a range of 0.61 mm×0.31 mm to 1.2 mm×0.9 mm. In this case, the opening 11o is suitable for disposing and embedding a 0603 chip (0.6 mm×0.3 mm) as the electric/electronic component 16.

The diameter of the circular opening 11o may be set within a range of 1.15 to 2.5 mm and the size of the rectangular opening 11o may be set within a range of 1.01 mm×0.51 mm to 1.6 mm×1.1 mm. In this case, the opening 11o is suitable for disposing and embedding a 1005 chip (1.0 mm×0.5 mm) as the electric/electronic component 16.

Since the opening 11o functions as disposing and embedding the electric/electronic component 16, the opening 11o forms an embedding region for the electric/electronic component 16.

Since the height of the electric/electronic component 16 is set almost within a range of 0.2 to 0.5 mm (in view of the 0402 chip) and the thickness of the insulating layer is set to several ten μm (e.g., a nominal thickness of 60 μm), the total thickness of the wiring board with a built-in component is set in the order of several tenth of one millimeter.

Figure 3:
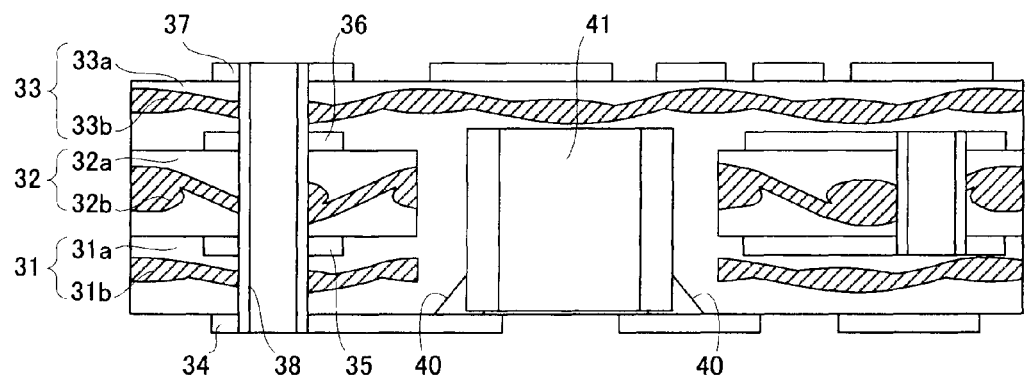
FIG. 3 relates to a cross sectional view schematically showing the structure of a wiring board with a built-in component according to another embodiment of the present invention.

Then, a wiring board with a built-in component according to another embodiment of the present invention will be described with reference to FIG. 3. FIG. 3 relates to a cross sectional view schematically showing the structure of the wiring board according to this embodiment. As shown in FIG. 3, the wiring board with a built-in component includes an insulating layers 31, 32, 33; wiring patterns 34, 35, 36, 37; conductive layers 38 formed on the inner wall of the respective through-holes, solders 40 and an electric/electronic component 41. The insulating layer 31, 32, 33 are made of respective insulating resins 31a, 32a, 33a and respective reinforcing materials (e.g., glass cloth) 31b, 32b, 33b for reinforcing the insulating resins 31a, 32a, 33a. In this embodiment, the thicker electric/electronic component 41 can be built in comparing with the wiring board relating to FIG. 1. The total number of wiring layer is set to four because two inner wiring layers are provided.

The electric/electronic component 41 is embedded in the insulating layer 31 and 32, and electrically and mechanically connected with the wiring pattern 34 via the solders 40. The insulating layer 31 is laminated on the same surface of the wiring pattern 34 as the electric/electronic component 41 is connected. The wiring pattern 35 is sandwiched between the insulating layer 31 and the insulating layer 32 laminated on the insulating layer 31. The wiring pattern 36 is also sandwiched between the insulating layer 32 and the insulating layer 33 laminated on the insulating layer 32. The wiring pattern 37 is provided on the other surface of the insulating layer 33 opposite to the surface contacting with the wiring pattern 36.

The reinforcing materials 31b and 32b of the insulating layers 31 and 32 are not provided in the region for the electric/electronic component 41 to be embedded. The wiring patterns 34, 35, 36, 37 are electrically connected one another with the conductive layers 38 formed at the inner walls of the respective through holes penetrating through the insulating layers 31, 32, 33. In the wiring board of this embodiment, a prepreg made of glass-epoxy resin can be easily employed as the insulating layers 31 and 32.

Figure 4:
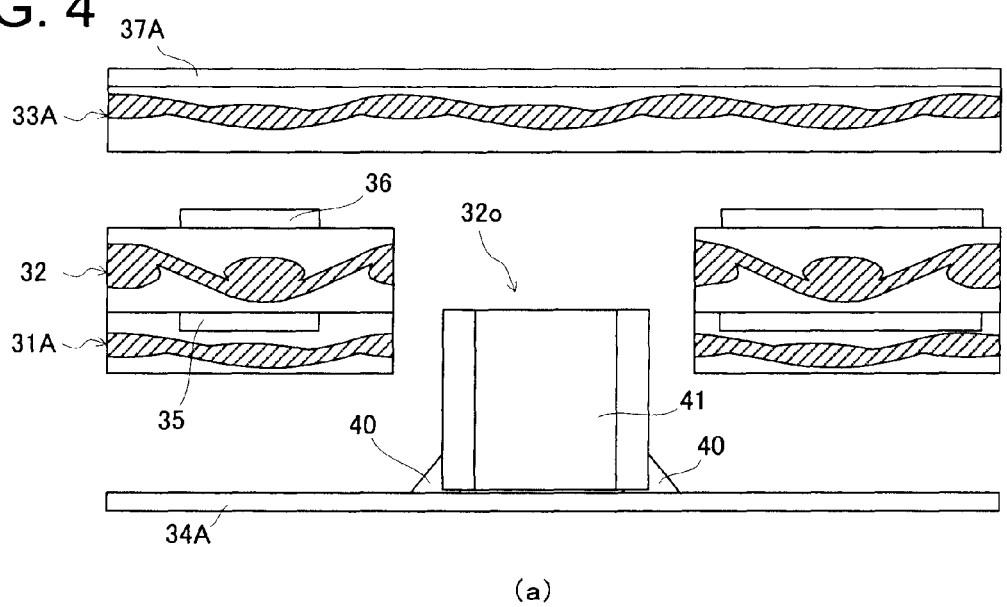
FIG. 4 relates to cross sectional views schematically showing the manufacturing steps of the wiring board shown in FIG. 3.
Figure 4:
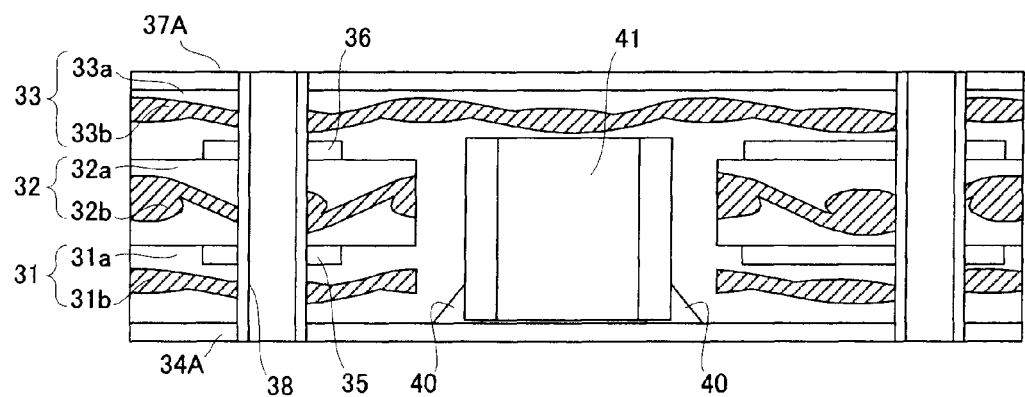

Then, the manufacturing process of the wiring board shown in FIG. 3 will be described referring to FIG. 4. FIG. 4 relates to cross sectional views schematically showing the manufacturing steps of the wiring board shown in FIG. 3. Herein, since the electric/electronic component 41 can be connected with a metallic foil (electrolytic copper foil) 34A in the same manner as FIGS. 2A and 2B, the explanation for the connection of the electric/electronic component 41 will be omitted and not depicted. The electric/electronic component 41 may be a chip resistance of 1005 size (with a thickness of 0.5 mm) or 2012 size.

As shown in FIG. 4A, a core plate containing the insulating layer 32 and a prepreg 31A (to be formed as the insulating layer 31) which are laminated one another and a prepreg 33A (to be formed as the insulating layer 33) on which a metallic foil (electrolytic copper foil) 37A is prepared in addition to the metallic foil 34A with which the electric/electronic component 41 is mounted. An opening 32o is formed at the core plate so as to correspond to the position for the electric/electronic component 41 to be disposed. The core plate may be formed as follows.

For example, a both-sided copper substrate (with the insulating layer 32) with a thickness of 0.5 mm is prepared so that the copper layers formed on both surfaces are patterned by means of well known photolithography to form the wiring patterns 35 and 36. The both-sided copper substrate may be FR-4. Then, a prepreg 31A of FR-4 with a nominal thickness of 60 μm is thermally laminated on the same surface of the insulating layer 32 as the wiring pattern 35 is formed. Then, the laminated body of the insulating layer 32 and the prepreg 31A is drilled to form an opening 32o for disposing the electric/electronic component 41 to be built-in. When the size of the electric/electronic component 41 is set to 1005 size, the diameter of the opening 11o may be set to 1.2 mm.

Then, as shown in FIG. 4A, the prepreg 33A with the metallic foil 37A thereon and the core plate as the laminated body of the prepreg 31A with the opening 32o are aligned for and laminated on the surface of the metallic foil 34A with the electric/electronic component 41 thereon.

After lamination, the prepregs 31A and 33A are heated to be rendered fluid and pressed along the stacking direction of the obtained laminated body so that the components of the laminated body are Integrated one another. In this case, the insulating resins 31a and 33a of the prepregs 31A and 33A embeds the space around the electric/electronic component 41 so as to be adhered with the electric/electronic component 41. In this case, the prepregs 31A and 33A are perfectly hardened to be the insulating layers 31 and 33, respectively. In the Integrated laminated body, since the opening 32o, corresponding to the position for disposing the electric/electronic component 41, is preliminarily formed at the insulating layer 32 and the prepreg 31A, the electric/electronic component 41 can not be pressed excessively through the disposition thereof. Therefore, excess stress can not occur at the connection (solders 40) between the electric/electronic component 41 and the metallic foil 34A and the electric/electronic component 41 can not be destroyed so that the reliability of the electric/electronic component 41, that is, the wiring board can be enhanced.

After lamination and integration, drilling and plating are conducted as is well known to form the both-sided shielding substrate with the conductive layers 38 formed at the inner walls of the respective through holes. Moreover, the metallic foils 34A and 37A are patterned by means of well known photolithography to form the wiring patterns 34 and 37. As a result, the wiring board with a built-in component as shown in FIG. 3 can be formed.

In this embodiment, the solders 40 are employed so as to connect the electric/electronic component 41 with the metallic foil 34A, but conductive adhesives may be employed instead of the solders 40. In this embodiment, the glass-epoxy resin is employed as the reinforcing materials 31b and 33b, but an aramid cloth, a glass nonwoven cloth or an aramid nonwoven cloth may be employed instead of the glass-epoxy resin. Moreover, the insulating layer 32 may be CEM-3 instead of FR-4.

After the copper layers formed at both surfaces of the both-sided copper substrate (with the insulating layer 32) are patterned to form the wiring patterns 35 and 36, the drilling and plating may be conducted to form the conductive layers at the inner walls of the respective through holes. In this case, the intended wiring board can be miniaturized. The through holes are embedded by the fluid insulating resins 31a and 33a at the subsequent laminating step.

Moreover, one opening is formed at the insulating layer 32 while another opening is formed at the prepreg 31A to form the opening 32o. In this case, it is required that the position of the opening formed at the insulating layer is aligned to the position of the opening formed at the prepreg 31A at the laminating step.

The pressing condition and the heating condition may be set in the same manner as the embodiment relating to FIG. 1. The heating process may be two-steps.

The size of the opening 32o defining the embedding region of the electric/electronic component 41 may be set in accordance with the size of the electric/electronic component 41 such as a 0402 chip, a 0603 chip or a 1005 chip. The total thickness of the wiring board with a built-in component is set in the order of several tenth of one millimeter.

Figure 5:
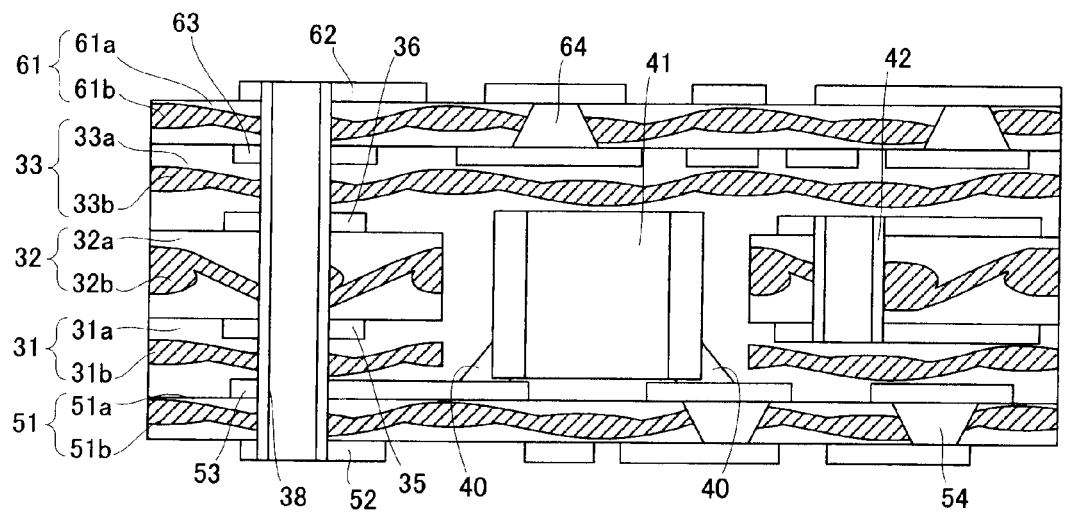
FIG. 5 relates to a cross sectional view schematically showing the structure of a wiring board with a built-in component according to still another embodiment of the present invention.

Then, a wiring board with a built-in component according to still another embodiment of the present invention will be described with reference to FIG. 5. FIG. 5 relates to a cross sectional view schematically showing the structure of the wiring board according to this embodiment. Like or corresponding components are designated by the same reference numerals and will not be explained. In this embodiment, two wiring layers are added so that the total number of wiring layer is set to six. As a result, the electric/electronic component 41 is connected with an inner wiring pattern 53. As is explained as a modified embodiment for the embodiment relating to FIG. 4, the core plate includes a conductive layer 42 on the inner wall of the through hole formed so as to penetrate the insulating layer 32.

In addition, the wiring pattern 34 in the embodiment relating to FIG. 3 is substituted with a both-sided wiring board made of an insulating layer 51 and wiring patterns 52, 53 formed at both surfaces of the insulating layer 51, and the wiring pattern 37 in the embodiment relating to FIG. 3 is substituted with a both-sided wiring board made of an insulating layer 61 and wiring patterns 62, 63 formed at both surfaces of the insulating layer 61. The wiring patterns 52, 53 are electrically connected with one another by an interlayer connector 54 sandwiched between the wiring patterns 52 and 53. The wiring patterns 62, 63 are electrically connected with one another by an interlayer connector 64 sandwiched between the wiring patterns 62 and 63. The insulating layers 51 and 61 are made of insulating resins 51a, 61a and reinforcing materials 51b, 61b (e.g., glass cloth), respectively.

Figure 6:
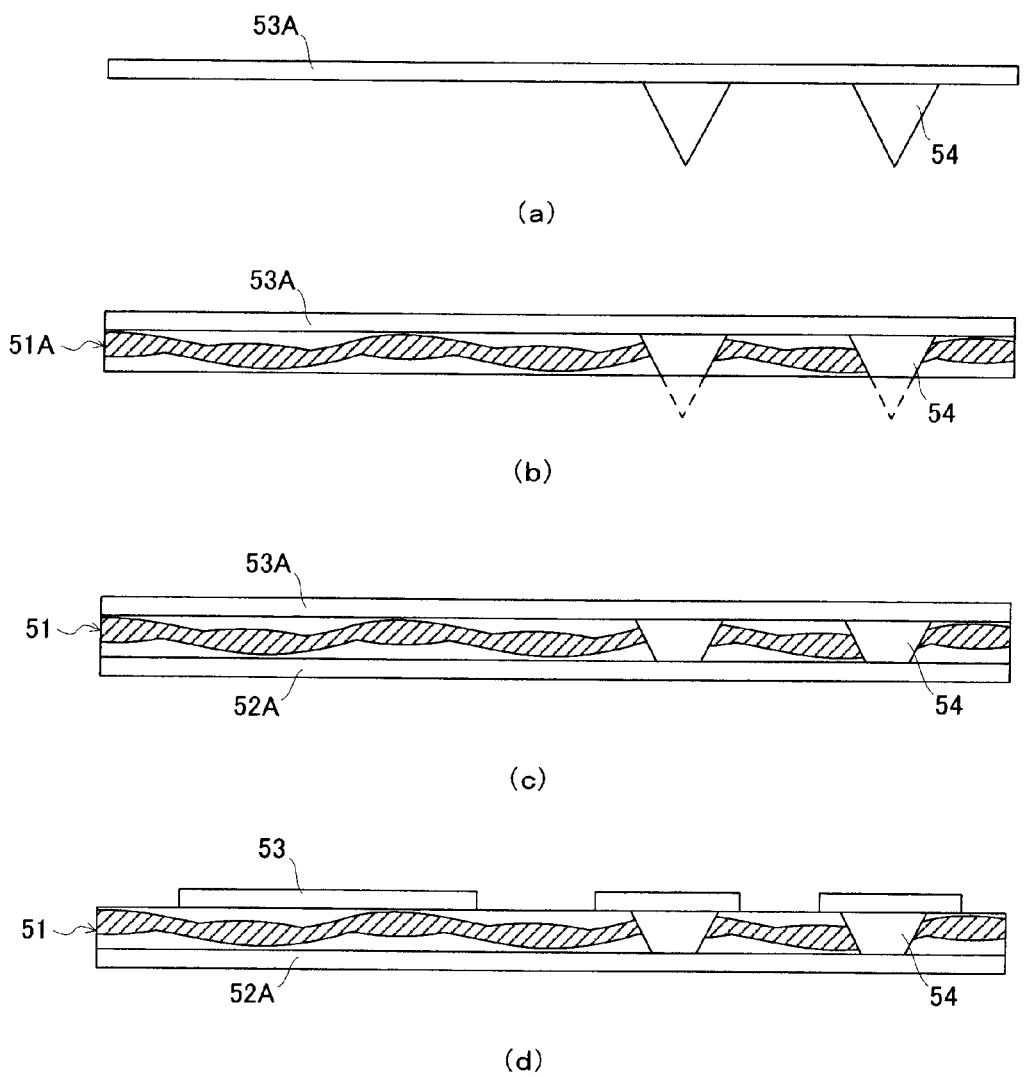
FIG. 6 relates to cross sectional views schematically and partially showing the manufacturing steps of the wiring board shown in FIG. 5.

Then, the manufacturing process of the wiring board shown in FIG. 5 will be described referring to FIG. 6. FIG. 6 relates to cross sectional views schematically and partially showing the manufacturing steps of the wiring board shown in FIG. 5. FIG. 6 is directed at the manufacturing steps for the formation of the both-sided wiring board made of the insulating layer 51 and the wiring patterns 52, 53 formed at both surfaces of the insulating layer 51. The manufacturing steps shown in FIG. 6 can be applied for the formation of the both-sided wiring board made of the insulating layer 61 and the wiring patterns 62, 63 formed at both surfaces of the insulating layer 61.

First of all, as shown in FIG. 6A, conductive composition pastes are formed on a metallic foil (e.g., electrolytic copper foil) 53A with a thickness of e.g., 18 μm by means of screen printing. The pastes are shaped in conical bump and formed as the interlayer connectors 54 later. The conductive composition is made by dispersing metallic fine particles of silver, gold or copper or carbon fine particles in a resin paste. In FIG. 6, the pastes are formed on the bottom surface of the metallic foil 53A, but may be on the top surface of the metallic foil 53A, which may be applied in the subsequent embodiments). The pastes are dried to form the interlayer connectors 54.

Then, as shown in FIG. 6B, a prepreg 51A with a nominal thickness of 60 μm is laminated on the metallic foil 53A so that the interlayer connectors 54 can penetrate the prepreg 51A and thus, the top ends of the interlayer connectors 54 are exposed from the prepreg 51A. The top ends of the interlayer connectors 54 may be flattened by means of deformation processing when or after the prepreg 51A is laminated (anyway, each interlayer connector 54 is configured such that the symmetric axis becomes parallel to the stacking direction of the prepreg 51A and the like, and the diameter is varied along the symmetric axis). Then, as shown in FIG. 6C, a metallic foil (electrolytic copper foil) 52A is laminated on the prepreg 51A so that the thus obtained laminated body is heated and pressed to integrate the metallic foils 52A, 53A and the prepreg 51A of the laminated body. In this case, the metallic foil 52A is electrically connected with the interlayer connectors 54 and the prepreg 51A is perfectly hardened to be the insulating layer 51.

Then, as shown in FIG. 6D, the metallic foil 53A is patterned by means of well known photolithography to form the wiring pattern 53. The metallic foil 34A shown in FIG. 4A is substituted with the laminated body shown in FIG. 6D. Therefore, the solders 40 under cream condition are applied on predetermined positions of the wiring pattern 53 by means of screen printing. In this case, the alignment process for the wiring pattern 53 is required. Moreover, the metallic foil 37A shown in FIG. 4A is substituted with the laminated body shown in FIG. 6D. Thereafter, the laminating process is conducted to integrate all of the components in the same manner as shown in FIG. 4, and then, conductive layers 38 on the inner walls of the respective through holes and both of metallic foils 52A and 62A are patterned, thereby forming the wiring board with a built-in component shown in FIG. 5.

In this embodiment, the laminated body as shown in FIG. 1 or 3 may be employed instead of the laminated body shown in FIG. 6D (herein, the top or bottom metallic foil is not patterned until the laminating process is conducted to integrate all of the components). In this case, a dense wiring board can be formed so that the electric/electronic component can be built therein.

The pressing condition and the heating condition may be set in the same manner as the embodiment relating to FIG. 1. The heating process may be two-steps.

The size of the opening defining the embedding region of the electric/electronic component 41 may be set in accordance with the size of the electric/electronic component 41 such as a 0402 chip, a 0603 chip or a 1005 chip as described in the embodiment relating to FIG. 1. The total thickness of the wiring board with a built-in component is set in the order of several tenth of one millimeter.

Figure 7:
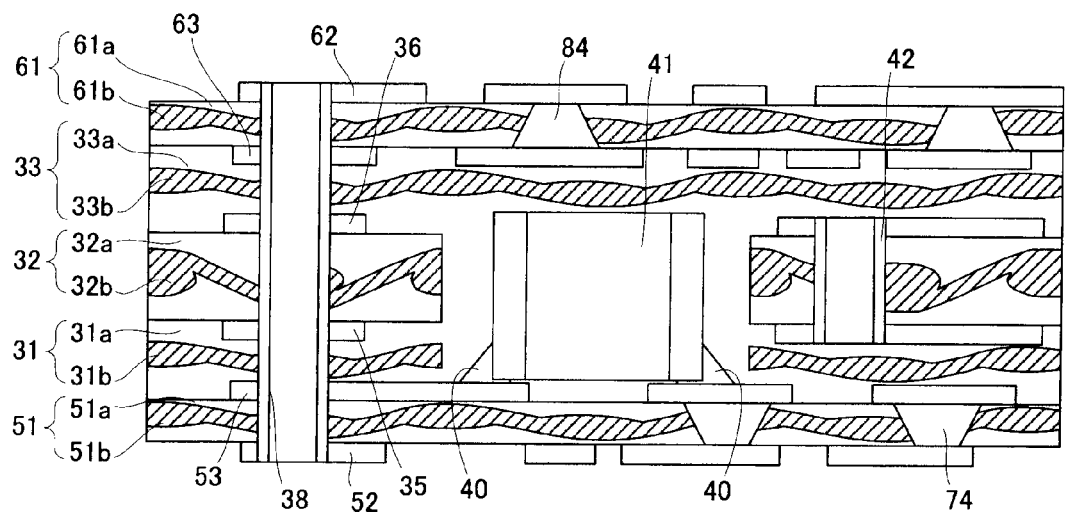
FIG. 7 relates to a cross sectional view schematically showing the structure of a wiring board with a built-in component according to a further embodiment of the present invention.

Then, a wiring board with a built-in component according to a further embodiment of the present invention will be described with reference to FIG. 7. FIG. 7 relates to a cross sectional view schematically and partially showing the structure of the wiring board according to this embodiment. Like or corresponding components are designated by the same reference numerals and will not be explained. In this embodiment, the interlayer connectors 54 and 64 of the wiring board shown in FIG. 5 are substituted with interlayer connectors 74 and 84 which are made of metallic material and configured such that the symmetric axis of each of the interlayer connectors becomes parallel to the stacking direction of the components and the diameter of each of the interlayer connectors is varied along the symmetric axis.

Figure 8:
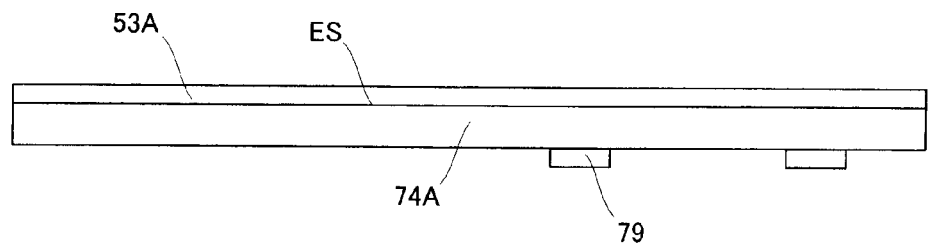
FIG. 8 relates to cross sectional views schematically and partially showing the manufacturing steps of the wiring board shown in FIG. 7.
Figure 8:
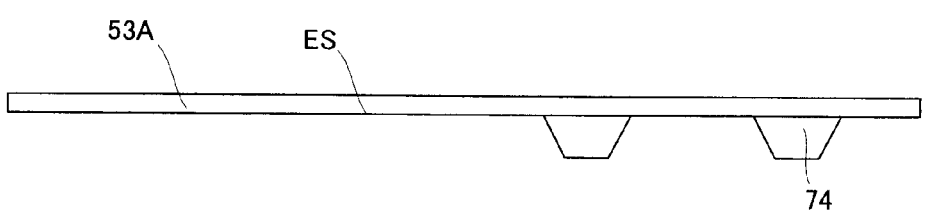

Then, the manufacturing process of the wiring board shown in FIG. 7 will be described referring to FIG. 8. FIG. 8 relates to cross sectional views schematically showing the manufacturing steps of the wiring board shown in FIG. 7. In FIG. 8, attention is paid to the manufacturing steps relating to the wiring pattern 53 and the interlayer connectors 74.

First of all, a laminated film made of the metallic foil (electrolytic copper foil) 53A with, e.g., a thickness of 18 μm and a thinner nickel alloy layer (functioning as an etching stopper layer ES) with, e.g., a thickness of 2 μm is prepared. Then, a metallic plate (copper plate) 74A is laminated on the etching stopper layer ES of the laminated film to form a three-layered clad material as shown in FIG. 8A. Then, an etching mask 79 is formed on the predetermined position of the metallic plate 74A.

Then, the metallic plate 74 with the etching mask 79 is exposed to an etching solution which can etch copper components to form the interlayer connectors 74 as shown in FIG. 8B. Then, the interlayer connectors 54 shown in FIG. 6A are substituted with the interlayer connectors 74 shown in FIG. 8A, and the subsequent manufacturing steps are conducted in the same manner as FIG. 6B to 6D. The manufacturing steps as described above are applied for the manufacturing steps relating to the wiring pattern 63 and the interlayer connectors 84.

The size of the opening defining the embedding region of the electric/electronic component 41 may be set in accordance with the size of the electric/electronic component 41 such as a 0402 chip, a 0603 chip or a 1005 chip as described in the embodiment relating to FIG. 1.

Figure 9:
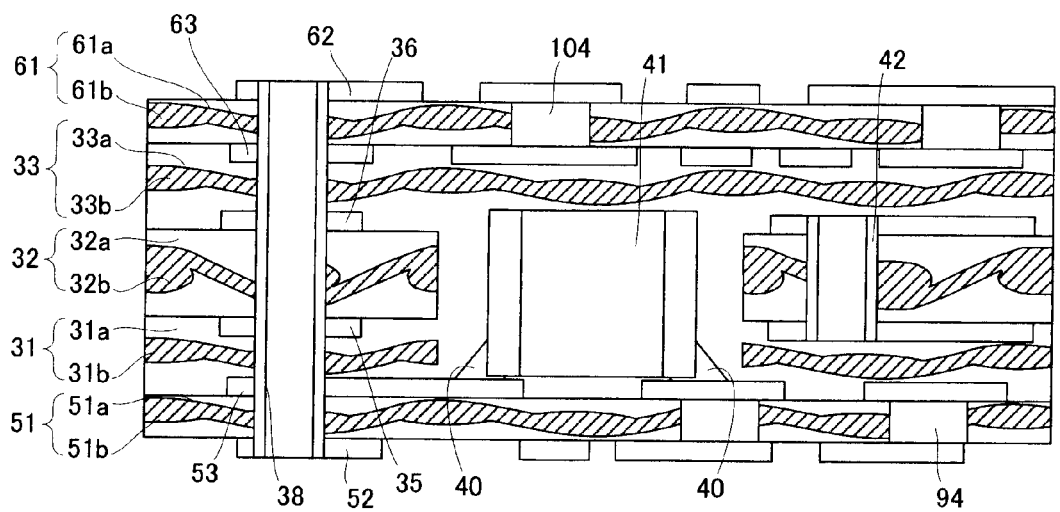
FIG. 9 relates to a cross sectional view schematically showing the structure of a wiring board with a built-in component according to a still further embodiment of the present invention.

Then, a wiring board with a built-in component according to a still further embodiment of the present invention will be described with reference to FIG. 9. FIG. 9 relates to a cross sectional view schematically and partially showing the structure of the wiring board according to this embodiment. Like or corresponding components are designated by the same reference numerals and will not be explained. In this embodiment, the interlayer connectors 54 and 64 of the wiring board shown in FIG. 5 are substituted with interlayer connectors 94 and 104 which are made of conductive composition and configured such that the symmetric axis of each of the interlayer connectors becomes parallel to the stacking direction of the components and the diameter of each of the interlayer connectors is not varied along the symmetric axis.

Figure 10:
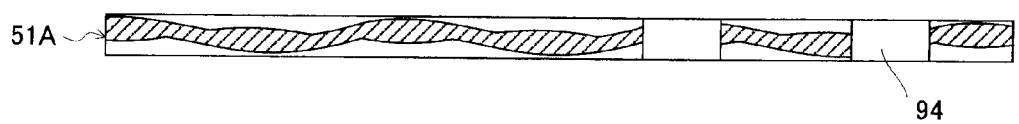
FIG. 10 relates to cross sectional views schematically and partially showing the manufacturing steps of the wiring board shown in FIG. 9.
Figure 10:
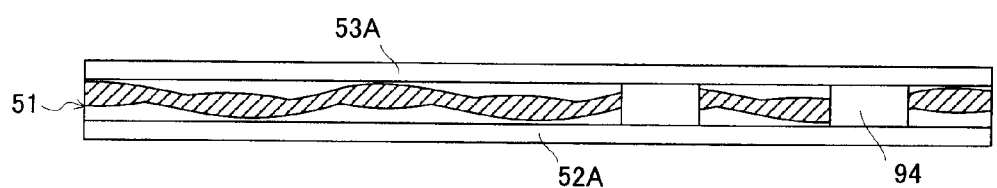
Figure 10:
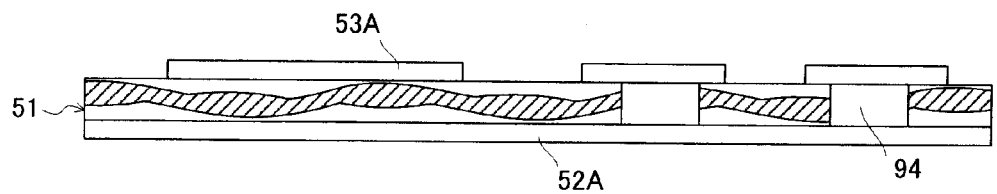

Then, the manufacturing process of the wiring board shown in FIG. 9 will be described referring to FIG. 10. FIG. 10 relates to cross sectional views schematically and partially showing the manufacturing steps of the wiring board shown in FIG. 9. In FIG. 10, attention is paid to the manufacturing steps relating to the insulating layer 51, the wiring patterns 52, 53 and the interlayer connector 94 penetrating through the insulating layer 51.

First of all, as shown in FIG. 1A, drilling is conducted for predetermined positions of the prepreg 51A with a nominal thickness of 60 μm so that the thus obtained openings are embedded with conductive composition to form the interlayer connectors 94. Then, as shown in FIG. 10B, the metallic foils (electrolytic copper foil) 52A and 53A with, e.g., a thickness of 18 μm are laminated on both surfaces of the prepreg 51A.

The thus obtained laminated body is heated and pressed to integrate the components of the laminated body. In this case, the metallic foils 52A and 53A are electrically connected with the interlayer connectors 94, and the prepreg 51A is perfectly hardened to be the insulating layer 51.

Then, as shown in FIG. 10C, the metallic foil 53A is patterned by means of well known photolithography to form the wiring pattern 53. The laminated body shown in FIG. 6D is substituted with the laminated body shown in FIG. 10C. The subsequent manufacturing steps can be performed as described in the embodiment relating to FIG. 6.

The pressing condition and the heating condition may be set in the same manner as the embodiment relating to FIG. 1. The heating process may be two-steps.

The size of the opening defining the embedding region of the electric/electronic component 41 may be set in accordance with the size of the electric/electronic component 41 such as a 0402 chip, a 0603 chip or a 1005 chip as described in the embodiment relating to FIG. 1. The total thickness of the wiring board with a built-in component is set in the order of several tenth of one millimeter.

Figure 11:
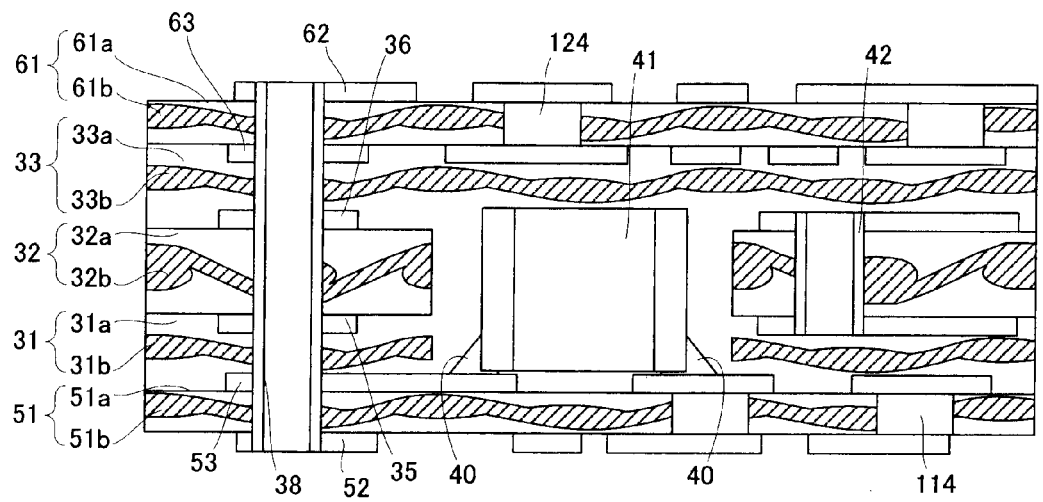
FIG. 11 relates to a cross sectional view schematically showing the structure of a wiring board with a built-in component according to another embodiment of the present invention.

Then, a wiring board with a built-in component according to another embodiment of the present invention will be described with reference to FIG. 11. FIG. 11 relates to a cross sectional view schematically and partially showing the structure of the wiring board according to this embodiment. Like or corresponding components are designated by the same reference numerals and will not be explained. In this embodiment, the interlayer connectors 54 and 64 of the wiring board shown in FIG. 5 are substituted with interlayer connectors 114 and 124 which are made of metallic material and configured such that the symmetric axis of each of the interlayer connectors becomes parallel to the stacking direction of the components and the diameter of each of the interlayer connectors is not varied along the symmetric axis.

Figure 12:
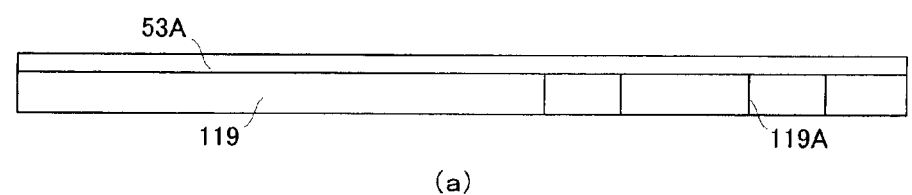
FIG. 12 relates to cross sectional views schematically and partially showing the manufacturing steps of the wiring board shown in FIG. 11.
Figure 12:
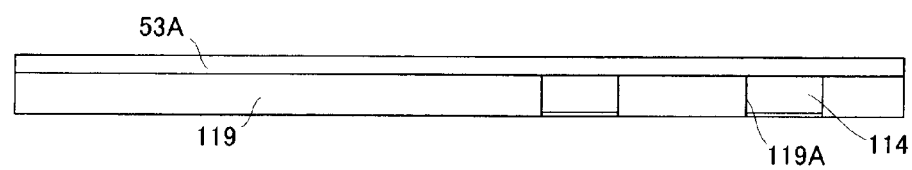
Figure 12:
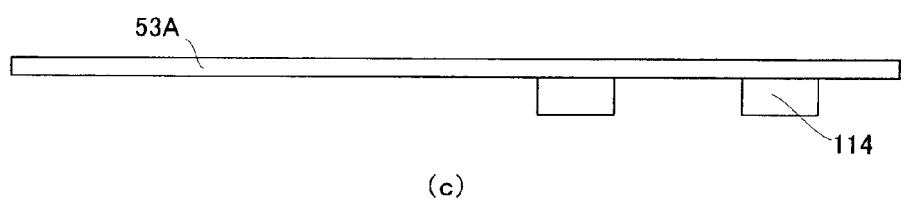

Then, the manufacturing process of the wiring board shown in FIG. 11 will be described referring to FIG. 12. FIG. 12 relates to cross sectional views schematically and partially showing the manufacturing steps of the wiring board shown in FIG. 11. In FIG. 12, attention is paid to the manufacturing steps relating to the wiring pattern 53 and the interlayer connectors 114.

First of all, as shown in FIG. 12A, a plate-stopping mask 119 is formed on the metallic foil (electrolytic copper foil) 53A with, e.g., a thickness of 18 μm. The plate-stopping mask 119 has mask-removing portions corresponding to the predetermined positions of the metallic foil 53A. The mask-removing portions are shaped cylindrically. Then, electrolytic plating is conducted for the plate-stopping mask 119 using the metallic foil 53A as a current supplying path to grow plated layers made of, e.g., copper in the respective mask-removing portions 119A, as shown in FIG. 12B. The plated layers function as the interlayer connectors 114. Thereafter, the plate-stopping mask 119 is removed to form a structural body as shown in FIG. 12C. The interlayer connectors 54 shown in FIG. 6A are substituted with the interlayer connectors 114 shown in FIG. 12C, and the subsequent manufacturing steps are conducted in the same manner as FIG. 6B to 6D. The manufacturing steps as described above are applied for the manufacturing steps relating to the wiring pattern 63 and the interlayer connectors 124.

In the embodiments relating to FIGS. 5 to 12, the wiring patterns 52 and 53 formed at both surfaces of the insulating layer 61 are electrically connected one another by the interlayer connectors, and the wiring patterns 62 and 63 formed at both surfaces of the insulating layer 61 are electrically connected one another by the interlayer connectors. However, the wiring patterns of both-sided wiring board as described above may be electrically connected one another by another means. For example, drilling is conducted for the insulating layer to form opening so that conductors are formed on the inner walls of the respective openings. The conductors may be formed by means of plating. Moreover, various both-sided wiring board may be formed using various interlayer connectors.

The pressing condition and the heating condition may be set in the same manner as the embodiment relating to FIG. 1. The heating process may be two-steps.

The size of the opening defining the embedding region of the electric/electronic component 41 may be set in accordance with the size of the electric/electronic component 41 such as a 0402 chip, a 0603 chip or a 1005 chip as described in the embodiment relating to FIG. 1. The total thickness of the wiring board with a built-in component is set in the order of several tenth of one millimeter.

Figure 13:
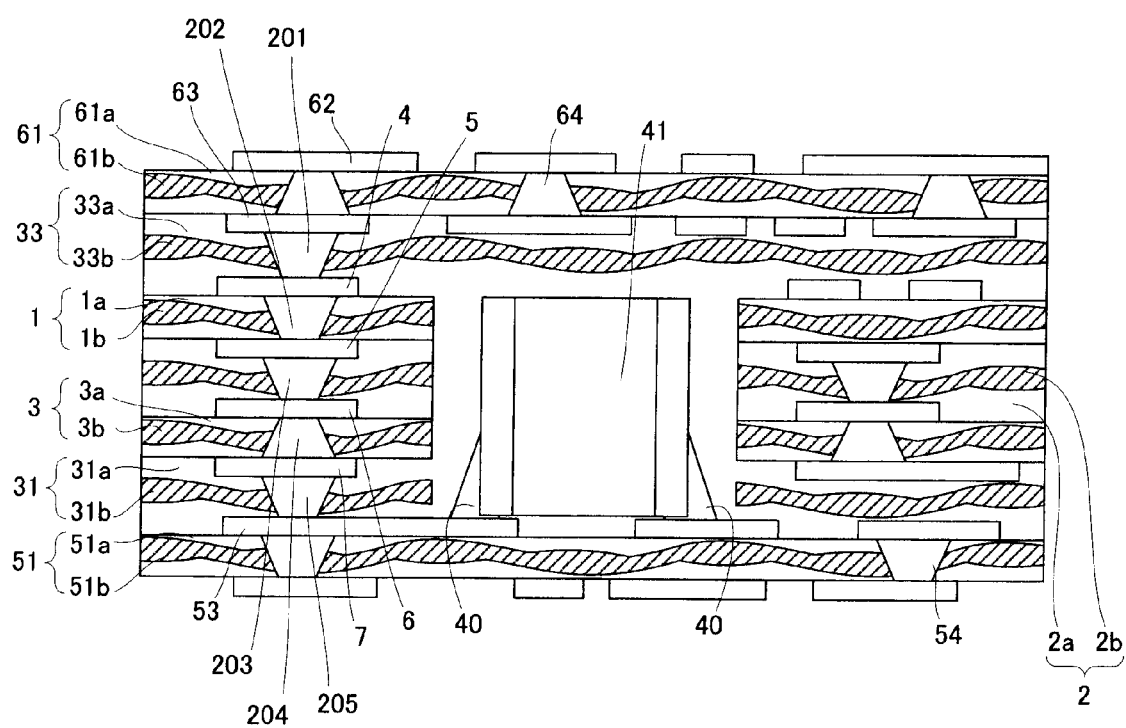
FIG. 13 relates to a cross sectional view schematically showing the structure of a wiring board with a built-in component according to a still another embodiment of the present invention.

Then, a wiring board with a built-in component according to another embodiment of the present invention will be described with reference to FIG. 13. FIG. 13 relates to a cross sectional view schematically and partially showing the structure of the wiring board according to this embodiment. Like or corresponding components are designated by the same reference numerals and will not be explained. The wiring board in this embodiment is different from the one in the embodiment relating to FIG. 5 in that interlayer connectors 205 and 201 are newly formed so as to penetrate through the respective insulating layers 31 and 33 and to be sandwiched between the wiring patterns formed at both surfaces of the insulating layers 31 and 33, and the insulating layer 32 is configured as a three-layered structure of insulating layers 3, 2, 1.

The wiring pattern 6 is sandwiched between the insulating layer 3 and the insulating layer 2. The wiring pattern 5 is sandwiched between the insulating layer 2 and the insulating layer 1. Interlayer connectors 204, 203, 202 are formed so as to penetrate through the respective insulating layers 3, 2, 1 and to be sandwiched between the respective wiring patterns. In this embodiment, since the interlayer connectors 205, 201, 204, 203, 202 are provided in addition to the interlayer connectors 54, 64, the conductive layer formed on the inner walls of the through-holes are not required.

The insulating layer 3, 2, 1 may be made of respective insulating resins 3a, 2a, 1a and the respective reinforcing materials 3b, 2b, 1b (e.g., glass cloth). The wiring pattern 7 and 4 correspond to the wiring patterns 35 and 36 in the embodiment relating to FIG. 5.

In this embodiment, the insulating layers 1, 2, 3, 31 do not have the reinforcing materials 1b, 2b, 3b, 31b in the region for the electric/electronic component 41 to be embedded and have the reinforcing materials 1b, 2b, 3b, 31b in other regions except the region with the electric/electronic component 41. Therefore, the electric/electronic component 41 can not be pressed excessively by the reinforcing materials 1b, 2b, 3b, 31b so that the reliability of the electric/electronic component 41, that is, the wiring board can be enhanced.

The manufacturing process of the wiring board shown in FIG. 13 will be described schematically. First of all, four both-sided wiring boards are formed for all of the insulating layers 51, 3, 1, 61. Each wiring board is configured such that the wiring pattern and the metallic foil formed at both surfaces of the insulating layer are electrically connected by the interlayer connector of which the diameter is varied along the stacking direction. Each wiring board can be formed in the same manner as shown in FIG. 6.

Then, conductive bumps, to be the interlayer connectors 203 later, are formed on the wiring pattern 5 by means of printing, and a prepreg, to be the insulating layer 2, is formed on the wiring pattern 5. Herein, the wiring pattern 5 is formed on a prepreg to be the insulating layer 1 later. Then, the wiring pattern 6 of the both-sided wiring board containing the prepreg to be the insulating layer 3 is contacted with the prepreg of the insulating layer 2. Then, the thus obtained laminated body is heated and pressed to integrate the components of the laminated body. Thereby, the wiring board with four wiring layers can be formed. Then, the top wiring layer and the bottom wiring layer of the laminated body are patterned to form the wiring patterns 7 and 4.

Then, conductive bumps, to be the interlayer connectors 205 later, are formed on the wiring pattern 7 by means of printing, and a prepreg, to be the insulating layer 31, is formed on the wiring pattern 7. Then, drilling is conducted for the thus obtained laminated body to form an opening (e.g., a diameter of 0.8 mm) for the electric/electronic component 41 to be built-in.

Then, conductive bumps, to be the interlayer connectors 201 later, are formed on the wiring pattern 63 by means of printing, and a prepreg, to be the insulating layer 33, is formed on the wiring pattern 63. Herein, the wiring pattern 63 is formed on a prepreg to be the insulating layer 61 later. Then, the electric/electronic component 41 is connected with the wiring pattern 53 via the solders 40. Herein, the wiring pattern 53 is formed on a prepreg to be the insulating layer 51.

The thus obtained three laminated bodies are pressed and laminated one another in the same manner as FIG. 4A. In this case, the insulating resins 31a and 31b of the prepregs of the insulating layers 31 and 33 embed the space around the electric/electronic component 41, and thus, adhered to the electric/electronic component 41. The prepregs are perfectly hardened to be the insulating layers 31 and 33. The top metallic foil and the bottom metallic foil of the thus obtained laminated body are patterned by means of well known photolithography to form the wiring patterns 52 and 62. In this way, the wiring board with a built-in component as shown in FIG. 13 can be obtained.

In the wiring board with a built-in component shown in FIG. 13, the interlayer connectors 204, 202 may be substituted with the interlayer connectors 74, 34 (FIG. 7); 94, 104 (FIG. 9); 114, 124 (FIG. 11). The interlayer connectors 205, 201 may be substituted with the interlayer connectors 94, 104 (FIG. 9A). In the latter case, the laminating step is conducted for five wiring boards.

The pressing condition and the heating condition may be set in the same manner as the embodiment relating to FIG. 1. The heating process may be two-steps.

The size of the opening defining the embedding region of the electric/electronic component 41 may be set in accordance with the size of the electric/electronic component 41 such as a 0402 chip, a 0603 chip or a 1005 chip as described in the embodiment relating to FIG. 1. The total thickness of the wiring board with a built-in component is set in the order of several tenth of one millimeter.

Then, a wiring board with a built-in component according to still another embodiment of the present invention will be described with reference to FIG. 14. FIG. 13 relates to a cross sectional view schematically and partially showing the structure of the wiring board according to this embodiment. Like or corresponding components are designated by the same reference numerals and will not be explained. In this embodiment, the wiring patterns are electrically connected with one another by the respective interlayer connectors instead of the conductors 38 formed on the inner walls of the respective through-holes. Each interlayer connector has a symmetric axis along the stacking direction and configured such that the diameter is varied along the symmetric axis.

Figure 14:
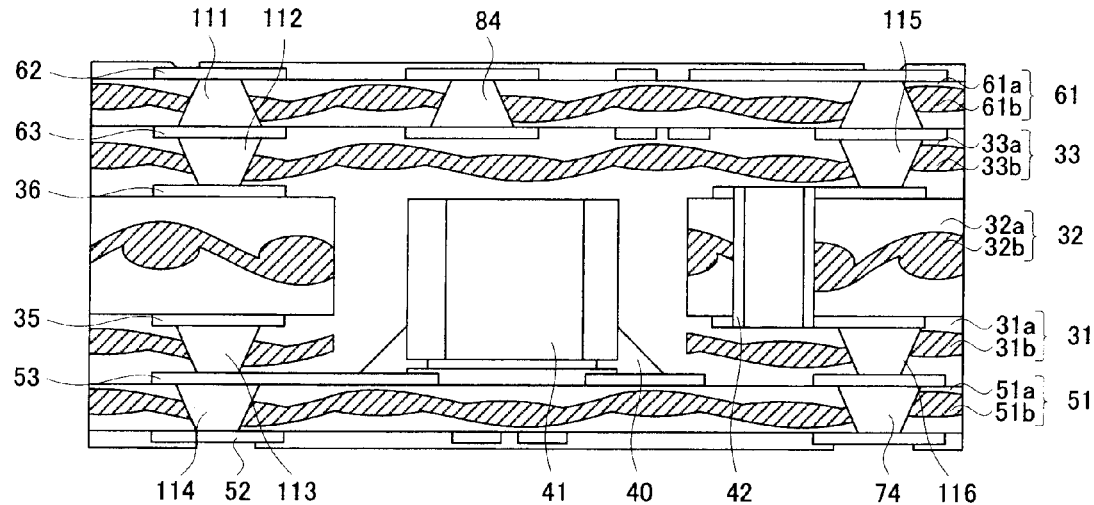
FIG. 14 relates to a cross sectional view schematically showing the structure of a wiring board with a built-in component according to a further embodiment of the present invention.

Concretely, as shown in FIG. 14, the wiring patterns 62 and 63 are electrically and mechanically connected with one another by the interlayer connectors 111 instead of the conductors 38. Each of the interlayer connectors 111 has a symmetric axis along the stacking direction and configured such that the diameter is varied along the symmetric axis. The wiring patterns 63 and 36 are electrically and mechanically connected with one another by the interlayer connectors 112. The wiring patterns 35 and 53 are electrically and mechanically connected with one another by the interlayer connectors 113. The wiring patterns 53 and 52 are electrically and mechanically connected with one another by the interlayer connectors 114. The interlayer connectors 112 to 114 are shaped as the interlayer connectors 111.

In this embodiment, moreover, the interlayer connectors 115 and 116 are also formed which are shaped as the interlayer connectors 111. The wiring patterns 63 and 36 are electrically and mechanically connected with one another by the interlayer connector 115, and the wiring patterns 35 and 53 are electrically and mechanically connected with one another by the interlayer connector 116.

Figure 15:
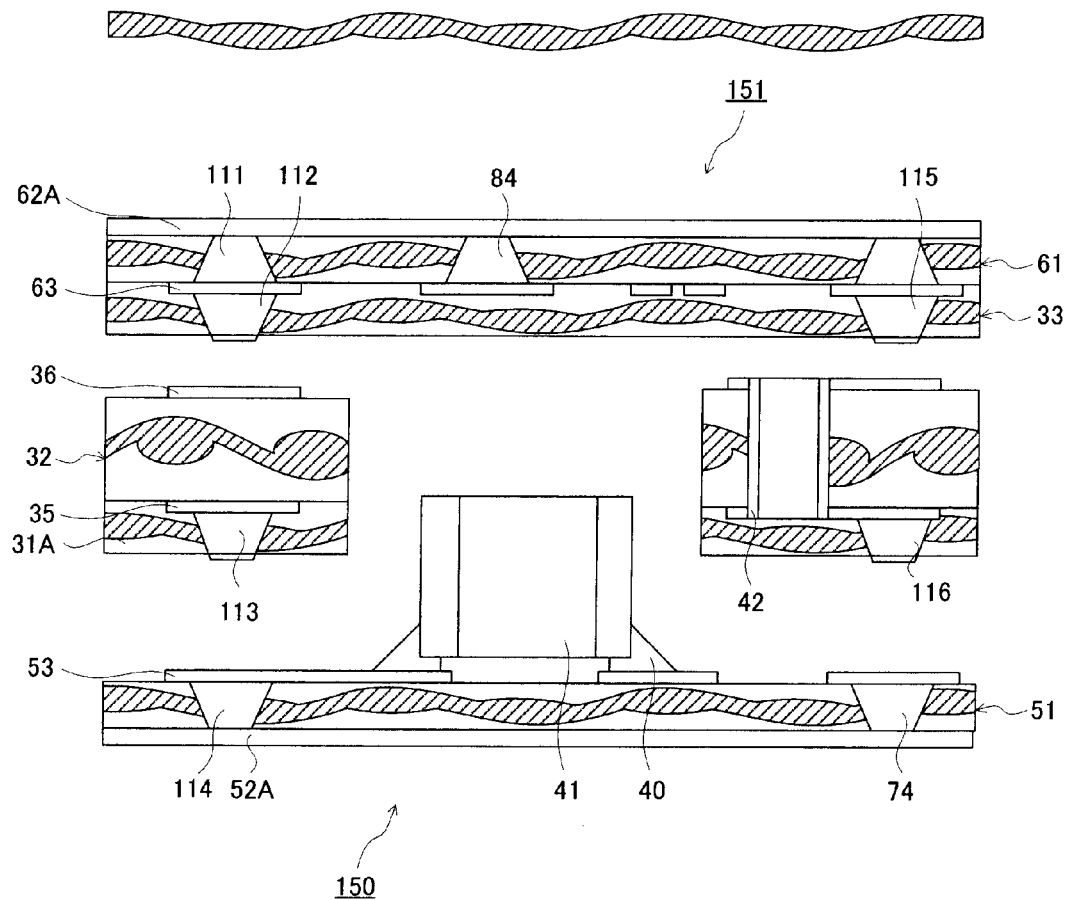
FIG. 15 relates to a cross sectional view simply showing the essential part of the manufacturing process of the wiring board shown in FIG. 14.

FIG. 15 relates to a cross sectional view simply showing the essential part of the manufacturing process of the wiring board shown in FIG. 14.

First of all, an assembly 150 is formed in the same manner as shown in FIGS. 2A, 2B and FIG. 6. In this case, the electric/electronic component 41 is electrically and mechanically connected with the wiring pattern 53 formed on the insulating layer 51 via the solders 40. The metallic foil 52A to be the wiring pattern 52 later is formed on the rear surface of the insulating layer 51 and the interlayer connector 114 is formed in the insulating layer 51.

An assembly 151 is also formed in the same manner as shown in FIG. 6. In this case, the insulating layers 61 and 33 are laminated so as to sandwich the wiring pattern 63, and the interlayer connectors 84, 112 and 115 are formed in the insulating layers 61 and 33.

Then, the laminated body with the insulating layer 32 and the prepreg 31A is prepared so that the wiring patterns 36 and 35 are formed and the conductors 42 are formed on the inner walls of the through-holes formed in the insulating layer 32 in the same manner as shown in FIG. 4. Then, the assemblies 150 and 151 are heated and pressed vertically via the laminated body. In this case, the prepreg 31A is rendered fluid to embed the space around the electric/electronic component 41 and adhere to the electric/electronic component 41. Also, the prepreg 31A is hardened to be the insulating layer.

Each interlayer connector may be made of the conductive composition which is made by dispersing metallic fine particles of silver, gold or copper or carbon fine particles in a resin paste, instead of the metallic foil.

The pressing condition and the heating condition may be set in the same manner as the embodiment relating to FIG. 1. The heating process may be two-steps.

The size of the opening defining the embedding region of the electric/electronic component 41 may be set in accordance with the size of the electric/electronic component 41 such as a 0402 chip, a 0603 chip or a 1005 chip as described in the embodiment relating to FIG. 1. The total thickness of the wiring board with a built-in component is set in the order of several tenth of one millimeter.

Although the present invention was described in detail with reference to the above examples, this invention is not limited to the above disclosure and every kind of variation and modification may be made without departing from the scope of the present invention.

What is claimed is:

1. A wiring board with a built-in component, comprising:
a wiring pattern;
an electric/electronic component electrically and mechanically connected with a surface of said wiring pattern; and
an insulating layer formed on the surface of said wiring pattern and configured so as to embed said component, said insulating layer including:
a first sub-layer having a lower surface in contact with said wiring pattern and a lateral surface in contact with said component; and
a second sub-layer laminated on an upper surface of said first sub-layer, said second sub-layer having an opening formed therethrough, said opening having an edge surrounding and spaced away from said component,
said first sub-layer and said second sub-layer each having an insulating resin and a reinforcing material included in the insulating resin,
said first sub-layer having a thickness such that said upper surface of said first sub-layer is at a level between an upper surface of said component and a lower surface of said component; and
an interlayer connector penetrating through said first sub-layer, said interlayer connector having an axis along a stacking direction of said wiring board and being connected to said component electrically through said wiring pattern,
wherein said reinforcing material of said first sub-layer reaches said interlayer connector without reaching said component; and
wherein said insulating resin of said first sub-layer reaches said interlayer connector and said component, and occupies a space between said edge of said opening of said second sub-layer and said component.

2. The wiring board as set forth in claim 1, further comprising:
a second insulating layer laminated on an upper surface of said second sub-layer; and
a second wiring pattern sandwiched by said second sub-layer and said second insulating layer.

3. The wiring board as set forth in claim 1, further comprising:
a second insulating layer formed on a different surface of said wiring pattern from the surface with which said component is connected.

4. The wiring board as set forth in claim 3, further comprising:
a second wiring pattern formed on an opposite surface of said second insulating layer to a surface thereof adjacent to said wiring pattern.

5. The wiring board as set forth in claim 4, further comprising:
a second interlayer connector made of conductive composition, sandwiched between said wiring pattern and said second wiring pattern by penetrating through said second insulating layer, and configured such that said second interlayer connector has an axis along a stacking direction of said wiring board and a diameter of said second interlayer connector is varied along said axis.

6. The wiring board as set forth in claim 4, further comprising:
a second interlayer connector made of conductive composition, sandwiched between said wiring pattern and said second wiring pattern by penetrating through said second insulating layer, and configured such that said second interlayer connector has an axis along a stacking direction of said wiring board and a diameter of said second interlayer connector is not varied along said axis.

7. The wiring board as set forth in claim 4, further comprising:
a second interlayer connector made of metallic material, sandwiched between said wiring pattern and said second wiring pattern by penetrating through said second insulating layer, and configured such that said second interlayer connector has an axis along a stacking direction of said wiring board and a diameter of said second interlayer connector is varied along said axis.

8. The wiring board as set forth in claim 4, further comprising:
a second interlayer connector made of metallic material, sandwiched between said wiring pattern and said second wiring pattern by penetrating through said second insulating layer, and configured such that said second interlayer connector has an axis along a stacking direction of said wiring board and a diameter of said second interlayer connector is not varied along said axis.

9. The wiring board as set forth in claim 4, further comprising:
a conductor formed on an inner wall of a through hole formed in said second insulating layer so as to electrically connect said wiring pattern and said second wiring pattern.

10. The wiring board as set forth in claim 2, further comprising:
a third wiring pattern formed on a surface of said second insulating layer, said surface of said second insulating layer being at a first side opposite to a second side of said second insulating layer where said second wiring pattern is placed; and
a second interlayer connector sandwiched between said second wiring pattern and said third wiring pattern by penetrating through said second insulating layer.

11. The wiring board as set forth in claim 10,
wherein said second interlayer connector is made of conductive composition and configured so as to have an axis along a stacking direction of said wiring board; and
wherein a diameter of said second interlayer connector is varied along said axis.

12. The wiring board as set forth in claim 10,
wherein said second interlayer connector is made of conductive composition and configured so as to have an axis along a stacking direction of said wiring board; and
wherein a diameter of said second interlayer connector is not varied along said axis.

13. The wiring board as set forth in claim 10,
wherein said second interlayer connector is made of metallic material and configured so as to have an axis along a stacking direction of said wiring board; and
wherein a diameter of said second interlayer connector is varied along said axis.

14. The wiring board as set forth in claim 10,
wherein said second interlayer connector is made of metallic material and configured so as to have an axis along a stacking direction of said wiring board; and
wherein a diameter of said second interlayer connector is not varied along said axis.

15. The wiring board as set forth in claim 2, further comprising:
a third wiring pattern sandwiched between said first sub-layer and said second sub-layer, wherein said interlayer connector is sandwiched between said wiring pattern and said third wiring pattern.

16. The wiring board as set forth in claim 15,
wherein said interlayer connector is made of conductive composition; and
wherein a diameter of said interlayer connector is varied along said axis.

17. The wiring board as set forth in claim 15,
wherein said interlayer connector is made of conductive composition; and
wherein a diameter of said interlayer connector is not varied along said axis.

18. The wiring board as set forth in claim 1,
wherein said component is a 0402 component with a size of 0.4 mm×0.2 mm, and
wherein when said opening of said second sub-layer is viewed in plane, said opening is shaped circularly so that a diameter of said opening is set with a range of 0.45 mm to 1.0 mm or shaped rectangularly so that a size of said region is set within a range of 0.41 mm×0.21 mm to 0.7 mm×0.5 mm.

19. The wiring board as set forth in claim 1,
wherein said component is a 0603 component with a size of 0.6 mm×0.3 mm, and
wherein when said opening of said second sub-layer is viewed in plane, said opening is shaped circularly so that a diameter of said opening is set with a range of 0.68 mm to 1.5 mm or shaped rectangularly so that a size of said opening is set within a range of 0.61 mm×0.31 mm to 1.2 mm×0.9 mm.

20. The wiring board as set forth in claim 1,
wherein said component is a 1005 component with a size of 1.0 mm×0.5 mm, and
wherein when said opening of said second sub-layer is viewed in plane, said opening is shaped circularly so that a diameter of said opening is set with a range of 1.15 mm to 2.5 mm or shaped rectangularly so that a size of said opening is set within a range of 1.01 mm×0.51 mm to 1.6 mm×1.1 mm.

21. A method for manufacturing a wiring board with a built-in component, comprising:
electrically and mechanically connecting an electric/electronic component with a metallic foil;
disposing, on said metallic foil, a first insulating layer having an opening larger than said component for accommodating said component, said opening having an edge, said first insulating layer having a first sub-layer whose lower surface faces said metallic foil and a second sub-layer laminated on an upper surface of said first sub-layer, said first sub-layer and said second sub-layer each having an insulating resin and a reinforcing material included in said insulating resin, said first sub-layer having a thickness such that said upper surface of said first sub-layer is at a level between an upper surface of said component and a lower surface of said component;
disposing a second insulating layer on said first insulating layer;
pressing, heating, and laminating said metallic foil, said first insulating layer, and said second insulating layer into an integrated structure while said insulating resin of said first sub-layer is rendered fluid so as to occupy a space between said edge of said opening in said second sub-layer and said component, and then, hardening said structure in a state in which said first sub-layer has a lateral surface in contact with said component, and said reinforcing material of said first sub-layer does not reach said component in a lateral direction; and
forming an interlayer connector penetrating through said first sub-layer, said interlayer connector having an axis along a stacking direction of said wiring board, being connected to said component electrically through said metallic foil, and being in contact with said reinforcing material of said first sub-layer.

22. A method for manufacturing a wiring board with a built-in component, comprising:
electrically and mechanically connecting an electric/electronic component with a metallic wiring pattern formed on a first insulating layer;
disposing, on said metallic wiring pattern, a second insulating layer having an opening larger than said component for accommodating said component, said opening having an edge, said second insulating layer having a first sub-layer whose lower surface faces said metallic wiring pattern and a second sub-layer laminated on an upper surface of said first sub-layer, said first sub-layer and said second sub-layer each having an insulating resin and a reinforcing material included in said insulating resin, said first sub-layer having a thickness such that said upper surface of said first sub-layer is at a level between an upper surface of said component and a lower surface of said component;
disposing a third insulating layer on said second insulating layer;
pressing, heating, and laminating said first insulating layer, said metallic wiring pattern, said second insulating layer, and third insulating layer into an integrated structure while said insulating resin of said first sub-layer is rendered fluid so as to occupy a space between said edge of said opening in said second sub-layer and said component, and then, hardening said structure in a state in which said first sub-layer has a lateral surface in contact with said component, and said reinforcing material of said first sub-layer does not reach said component in a lateral direction; and
forming an interlayer connector penetrating through said first sub-layer, said interlayer connector having an axis along a stacking direction of said wiring board, being connected to said component electrically through said metallic wiring pattern, and being in contact with said reinforcing material of said first sub-layer.

\* \* \* \* \*